US 6,919,239 B2
Jul. 19, 2005

(12) United States Patent
Zhang (10) Patent No.: US 6,919,239 B2
(45) Date of Patent: Jul. 19, 2005

(54) METHOD FOR FORMING A SEMICONDUCTOR DEVICE (75) Inventor: Hongyong Zhang, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 10/726,529

(22) Filed: Dec. 4, 2003

(65) Prior Publication Data

US 2004/0110385 A1 Jun. 10, 2004

Related U.S. Application Data (62) Division of application No. 09/222,776, filed on Dec. 30, 1998, now Pat. No. 6,660,575, which is a division of application No. 08/300,938, filed on Sep. 6, 1994, now Pat. No. 5,938,839, which is a continuation of application No. 07/956,860, filed on Oct. 5, 1992, now abandoned.

(30) Foreign Application Priority Data

Oct. 4, 1991 (JP) ................................. 3-283981
Oct. 8, 1991 (JP) ................................. 3-290719

(51) Int. Cl.[7] ................................. H01L 21/00
(52) U.S. Cl. ................................. 438/166
(58) Field of Search ................................. 438/166, 164, 438/308, 487, 306, 486

(56) References Cited

U.S. PATENT DOCUMENTS

| 3,771,026 | A | 11/1973 | Asai et al. |
| 4,266,986 | A | 5/1981 | Benton et al. |
| 4,552,595 | A | 11/1985 | Hoga |
| 4,555,301 | A | 11/1985 | Gibson et al. |
| 4,569,697 | A | 2/1986 | Tsu et al. |
| 4,638,110 | A | 1/1987 | Erbert |
| 4,758,533 | A | 7/1988 | Magee et al. |

(Continued)

FOREIGN PATENT DOCUMENTS

| JP | 56-142651 | 11/1981 |
| JP | 57-202729 | 12/1982 |
| JP | 58-092216 | 6/1983 |
| JP | 60-216538 | 10/1985 |
| JP | 60-245174 | 12/1985 |
| JP | 61-199640 | 9/1986 |
| JP | 61-255014 | 11/1986 |
| JP | 61-255016 | 11/1986 |
| JP | 62-264619 | 11/1987 |
| JP | 01-259530 | 10/1989 |
| JP | 86115 | 3/1990 |
| JP | 02-114521 | 4/1990 |
| JP | 02-224339 | 9/1990 |
| JP | 03-148836 | 6/1991 |
| JP | 03-178125 | 8/1991 |

OTHER PUBLICATIONS

S.Wolf and R.N Tauber, Silicon Processing for the VLSI Era, Lattice Press, vol. 1:Process Technology, pp. 177–178.*
Kawachi et al., "Large–Area Doping Process for Fabrication of poly–Si Thin Film Transistors Using Bucket Ion Source and XeCl Excimer Laser Annealing," Japanese Journal of Applied Physics, vol. 29, No. 12, Dec. 1990, pp. L2370–2372.
Inoue et al., "Low Temperature CMOS Self–Aligned Poly–Si TFTs and Circuit Scheme Utilizing New Ion Doping and Masking Technique", 1991 IEEE 20.1.1–20.1.4 IEDM, Aug. 12, 1991, pp. 555–558.

(Continued)

Primary Examiner—Michael Tran
Assistant Examiner—Quoc Hoang
(74) Attorney, Agent, or Firm—Nixon Peabody LLP; Jeffrey L. Costellia (57) ABSTRACT A method for forming a semiconductor device is disclosed. The method comprises the step of irradiating a laser light to a surface of a semiconductor through a mask provided on said surface in an atmosphere comprising an impurity of one conductivity type to diffuse said impurity into a region of said semiconductor.

20 Claims, 9 Drawing Sheets

U.S. PATENT DOCUMENTS

| | | | |
|---|---|---|---|
| 4,885,260 | A | 12/1989 | Ban et al. |
| 4,933,298 | A | 6/1990 | Hasegawa |
| 5,104,455 | A | 4/1992 | Yokota et al. |
| 5,114,876 | A | 5/1992 | Weiner |
| 5,151,383 | A | 9/1992 | Meyerson et al. |
| 5,200,630 | A | 4/1993 | Nakamura et al. |
| 5,306,651 | A | 4/1994 | Masumo et al. |
| 5,352,291 | A | 10/1994 | Zhang et al. |
| 5,372,836 | A | 12/1994 | Imahashi et al. |
| 5,424,244 | A | 6/1995 | Zhang et al. |
| 5,766,344 | A | 6/1998 | Zhang et al. |
| 5,849,043 | A | 12/1998 | Zhang et al. |
| 5,861,337 | A | 1/1999 | Zhang et al. |
| 6,660,575 | B1 * | 12/2003 | Zhang .................... 438/166 |

OTHER PUBLICATIONS

Stringfellow, "Vapor Phase Growth", Crystal Growth, vol. 16, $2^{nd}$ Edition, Pampline, Chapter 5, pp. 181–202.

Takenaka et al., "High Mobility Poly–Si Thin Film Transistors Using Solid Phase Crystallized A–Si Films Deposited by Plasma–Enhanced Chemical Vapor Deposition", Japanese Journal of Applied Physics, vol. 29, No. 12, Dec. 1990.

Boyd, "Laser–Enhanced Oxidation of Si", Applied Physics Letters, vol. 42, No. 8, pp. 728–730.

Craciun et al., "Direct Laser Synthesis of Thin Silicon and Germanium Nitride/Oxynitride Layers", Nucl. Instrum. Methods Phys. Res. B, Beam Interact. Mater At., vol. B65, No. 1–4, pp. 115–118 (Mar. 1992).

Craciun et al., "Direct Oxynitride Synthesis by Multipulse Excimer Laser Irradiation of Silicon Wafers in a Nitrogen–Containing Ambient Environment", J. Appl. Phys, vol. 68, No. 5, Sep. 1, 1990, pp. 2509–2511.

Russell et al., "Bipolar Transistors in Silicon–on–Sapphire (SOS) Effects of Nanosecond Thermal Processing", IEEE SOS/SOI Tech. Conf. Proceedings Oct. 24, 1990.

Wolf et al., Silicon Processing for the VLSI Era vol. 1: Process Technology, Lattice Press, Sunset Beach, CA, (1989), pp. 471, 476–479.

Carey et al., "Submicrometer CMOS Device Fabrication Using Gas Immersion Laser Doping (GILD)", IEEE Transactions on Eletcron Devices, vol. 35, No. 12, Dec. 1988, p. 2429.

Weiner et al., "Thin–Base Bipolar Transistor Fabrication Using Gas Immersion Laser Doping", IEEE Electron Dev. Lett., vol. 10, No. 6, (1989), pp. 260–263.

Turner et al., "Gas Immersion Laser Diffusion for Efficient Cell Fabrication and Grain Boundary Research", $16^{th}$ IEEE Photovoltaic Specialist Conference, San Diego, CA, Sep. 27–30, 1982, pp. 775–780.

Carey et al., "Ultra–Shallow High Concentration Boron Profiles for CMOS Processing", IEEE Electron Dev. Lett., vol. EDL–6, No. 6, (1985), pp. 291–293.

Carey et al., "Fabrication of Submicrometer MOSFETS Using Gas Immersion Laser Doping (GILD)," IEEE Electron Dev. Lett., vol. EDL–7, No. 7, (1986), pp. 440–442.

Weiner et al., "Measurement of Melt Depth Limited Diffusion in Gas Immersion Laser Doped Silicon Using an Improved Laser System," (In Proceedings of the Symposium on Laser Processing for Microelectronic Applications) (1988), pp. 53–61.

Matsuo et al., "Low–Temperature Activation of Impurities Implanted by Ion Doping Technique for Poly–Si Thin–Film Transistors", Jpn. J. Appl. Phys., vol. 31, Part I, No. 12B, Dec. 1992, pp. 4567–4569.

Mishima et al., "Implantation Temperature Effect on Polycrystalline Silicon by Ion Shower Doping", J. Appl. Phys., vol. 74, No. 12, Dec. 15, 1993, pp. 7114–7117.

Bruno et al., RF Plasma deposition of a–silicon–germanium alloys: evidence for chemisorption–based growth process, pp. 934–939, (IEEE), Dec., 1990.

\* cited by examiner

METHOD FOR FORMING A SEMICONDUCTOR DEVICE

This application is a Div of Ser. No. 09/222,776 Dec. 30, 1998 U.S. Pat. No. 6,660,575 which is a Div of Ser. No. 08/300,938 Sep. 6, 1994 U.S. Pat. No. 5,938,839 which is a CON of Ser. No. 07/956,860 Oct. 5, 1992 ABN.

BACKGROUND OF THE INVENTION

1. Field of the Invention

The present invention relates to a partial doping technology with an impurity, which is necessary for a preparing process of such semiconductor device as MOS (Metal-Oxide-Semiconductor) type or CMOS (Complementary Metal-Oxide-Semiconductor) type semiconductor device. In particular, the present invention provides a doping technology, which is capable of a selective method to dope a different region with a different impurity, using a simple and convenient process, and also which is capable of an efficient doping in a low temperature process.

2. Description of the Related Art

It is indispensable to arrange a process for partially controlling of a resistance rate, by adding an impurity which selectively gives one conductivity type to a part of semiconductor, in case where such semiconductor device as MOSFET (Metal-Oxide-Semiconductor Field-Effect-Transistor) or CMOS type device is prepared.

In a conventional process, an impurity doping has been carried out by the following method. First of all, a shield film is formed on a surface of semiconductor to keep away the intrusion of impurity. Then, the shield film in the region, where a doping will be effected in accordance with a photolithography process, is removed to form a mask. After that, the doping with a needed impurity is executed by a heat-diffusion method or an ion-implantation method.

However, such doping method in the conventional process as mentioned above creates the following problems.

(1) In case where an impurity is doped in a semiconductor by a heat-diffusion method, there poses a problem that a high temperature process is required. For example of a silicon semiconductor, it is necessary to heat a silicon semiconductor sample at a temperature of 1000 to 1200° C., thereby making it difficult to form a shallow impurity layer which is required for a high density IC, and posing a problem of impurity redistribution and defect resulted from the high temperature process.

(2) In case of the impurity doping method by an ion-implantation, there poses the same problem as mentioned in the above (1), because it is in need of a post heat-treatment at a temperature of 600 to 950° C., to activate the impurity and to recover the defect.

Also, as a problem in common with the heat-diffusion method and the ion-implantation method stated above, both of them need a high temperature process extremely over 600° C. For example, in case of an active matrix type liquid crystal display device to which an attention has been paid recently, since MOS type thin film transistor (TFT) is formed on a glass substrate, it has been difficult to employ the above heat-diffusion method and the ion-implantation method, if a cheap glass substrate which has a heat resistant temperature of 600 to 700° C. is used.

Further, in case of a selective doping, it is needed to form a mask as mentioned above. Then, a photolithography process followed by a complicated process will be required, and it has been well known that the photolithography causes a yield to be lowered.

As noted above, there has been a preparing problem that the high temperature process is required in the conventional impurity doping method, and further, a mask forming process, which is in need of a photolithography process for the selective doping, is required. So far, as a doping technology, a heat-diffusion method and an ion-implantation method have been known. In the heat-diffusion method, an impurity will be diffused into a semiconductor at such a high temperature as 1000 to 1200° C., and in the ion-implantation method, an ionized impurity will be accelerated in an electric field to be implanted in a prescribed place.

However, the diffusion coefficient of impurity, D is shown as $D=D_0 \exp[-E_a/kT]$, and it is dependent on the absolute temperature T by the exponential function. Here, $D_0$ is a diffusion coefficient at $T=\infty$, and k is Boltzman coefficient. Then, it has been preferable to effectively diffuse the impurity into a semiconductor at as high temperature as possible, and it has been generally conducted at a temperature above 1000° C., in case of the heat-diffusion method. Also in case of the ion-implantation method, it has been needed for the activation of impurity and the recovery of defect to carry out a post heat-treatment process at a temperature of 600 to 950° C.

In recent years, an active matrix type liquid display device, which uses a TFT (Thin Film Transistor) provided on a glass substrate as a switching element of pixel, has been partly put into practical use. But it is common that these form the source, drain region of TFT as an ohmic contact, with one conductive type amorphous silicon. Also, the structure of TFT takes an inverse stagger type, and as a structural problem, it has been prone to generate a parasitic capacity.

Accordingly, the usage of TFT which forms the source, drain region by self-alignment has been investigated. For that purpose, it has been required to employ an ion-implantation method or an ion-shower method. These methods, however, have been in need of the post heat-treatment process at a temperature of 600 to 950° C., so as to activate an impurity and recover a defect, as mentioned above, and it has been industrially difficult to use them, considering that a heat resistant temperature of a cheap glass substrate is in the range of 600 to 700° C.

To solve such heat damage problem as is given to a glass substrate, a doping technology using a laser beam irradiation has been known. For an example of them, there is a method that a thin film of impurity is formed on the semiconductor surface into which a doping is to be effected, then by an irradiation of laser beam, the thin film of impurity and the semiconductor surface is molten to dissolve the impurity. There is also another method that an impurity is added and diffused into a semiconductor through a gaseous phase, by an irradiation of laser beam toward the semiconductor surface, in an atmosphere of reactive gas containing an impurity to be doped. Particularly, in case of using a pulse irradiation type excimer laser, it has a feature that the temperature of glass substrate will only become momentarily around 300 even in using a glass substrate, and then the heat damage to the glass substrate can be beside the question.

The above method to conduct a doping by an irradiation of excimer laser beam does not cause heat damage to a glass substrate. It, therefore, can prevent the substrate from being defective by the heat damage. But it poses a problem that a doping efficiency will be lowered, as an energy will not be absorbed in a reactive gas according to the wave length of laser beam. For instance, in the using of the alexandrite laser beam (wave length 745 nm), $PH_3$ gas can not be decomposed directly. Also, in the using of $AsH_3$ and $PH_3$ containing pentavalent impurity, or $B_2H_6$ containing trivalent impurity, as a reactive gas for a doping (doping gas), each gas of them varies in its absorbing wave band. So that, in case where the doping of different element has to be effected, by using various kind of reaction gases, there arises a problem that the doping concentration will be disproportioned.

For example, in case a complementary type device composed of P-channel type TFT (hereinafter referred to as PTFT) and N-channel type TFT (hereinafter referred to as NTFT) is formed, or in case CMOS device is formed, it is needed to use separately each doping gas of N-type providing one and P-type providing one. Therefore, this has been a problem that the doping gas is restricted owing to a sort of laser, and the laser suitable for each doping gas should be respectively prepared.

SUMMARY OF THE INVENTION

Accordingly, it is an object of the present invention to solve the lowering of doping efficiency, which is caused by a reason that the same laser beam will not decompose a different doping gas, in case where a plurality of dopings are effected by employing different doping gases, in the doping technology through a gas phase using the above stated laser beam, in particular using the excimer laser beam.

In order to realize the above object to solve the problem in the conventional impurity doping, the following methods are proposed according to the present invention.

(1) A method for forming a semiconductor device comprising setting up a mask on a surface of semiconductor being placed in an atmosphere containing an impurity which gives one conductivity type, and diffusing said impurity into the partial region of the semiconductor, by an irradiation of a laser beam (laser light) to the surface of a semiconductor through said mask in said atmosphere, thereby making it possible to decrease the resistance rate of said region.

(2) A preparing method for a semiconductor in a selective doping method with an impurity giving a different conductivity type, comprising the process steps of: (a) Setting up a mask on a surface of semiconductor being placed in an atmosphere containing an impurity which gives P-type or N-type conductivity; (b) diffusing said impurity giving the one conductivity type into the first region of semiconductor by an irradiation of laser beam toward the surface of semiconductor through said mask; and (c) changing the later atmosphere of said process (b) into an atmosphere containing the impurity which gives N- or P-type conductivity, and also changing the position of the mask, through which a laser beam being irradiated toward the surface of semiconductor, thus making it possible to diffuse the impurity which gives N- or P-type conductivity into the second region of semiconductor.

Figure 4A:
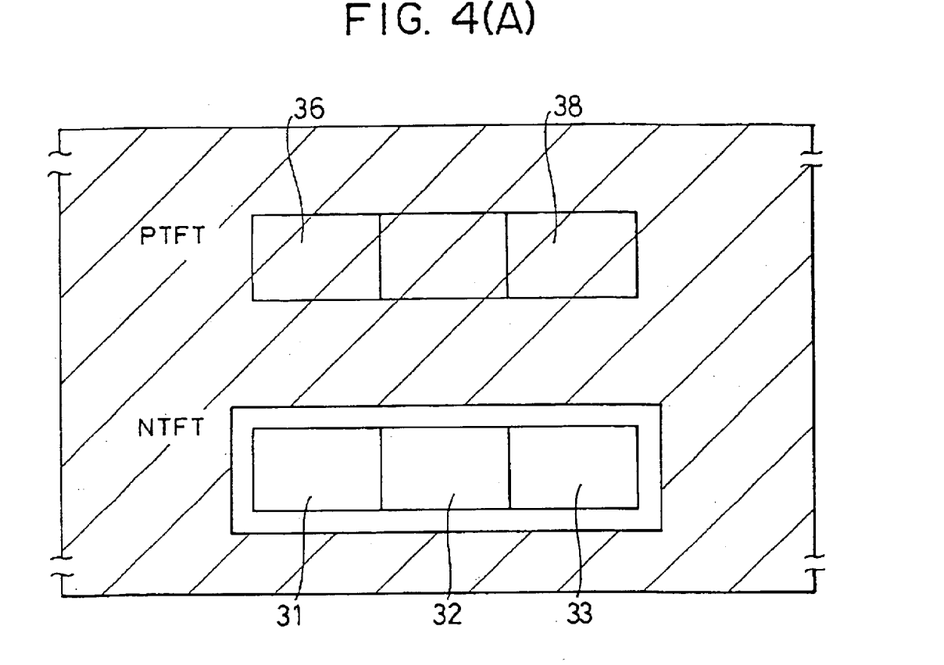
FIG. 4 shows a positioning relationship of the mask in accordance with the Example 2.
Figure 4B:
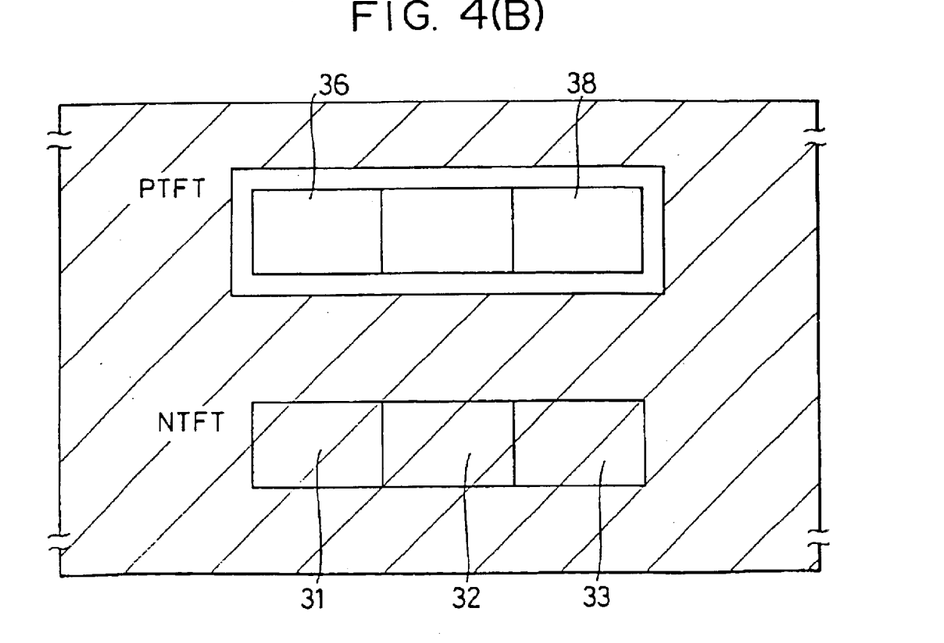

In one example of the present invention, the mask comprises a transparent plate, e.g. a quartz plate, and a metallic pattern formed thereon. In this case, a transparent part of the mask is a part of the transparent plate on which a material of the metallic pattern is not provided. The laser light is irradiated to the surface of the semiconductor through the transparent part of the mask. The transparent part may be located on a semiconductor region of the semiconductor and a gate electrode provided on the semiconductor region during the irradiation as illustrated in FIGS. 4(A) and 4(B). In this case, the laser light reaches a surface of the gate electrode and a surface portion of the semiconductor region through the transparent part during the irradiation, and a portion of the semiconductor region is not irradiated with the laser light under the gate electrode during the irradiation. Source and drain regions are then formed in the semiconductor with a channel region therebetween under the gate electrode by the diffusion of the impurity. In another example of the present invention, the mask is a metallic mask pattern having an opening. In this case, the laser light is irradiated to the surface of the semiconductor through the opening.

In the above stated present invention, as the impurity which gives one conductivity type, it is a trivalent element and a pentavalent element respectively, in compliance with P-type and N-type of a silicon semiconductor. As the atmosphere containing an impurity which gives one conductivity type, if the conductivity is P-type, it is usually possible to use $B_2H_6$ of a reactive gas containing B (boron), a trivalent impurity which gives P-type conductivity. And if the conductivity is N-type, it is usually possible to use $PH_3$ of a reactive gas containing P (phosphorus), a pentavalent impurity which gives N-type conductivity.

As the semiconductor, it is general to use a silicon semiconductor, but it is possible to use other ones. The fundamental point of the present invention, wherein the impurity is diffused into a semiconductor by an irradiation of laser beam, in an atmosphere containing an impurity element to be doped with, is not restricted by a kind of semiconductor. Also, as the crystal structure of semiconductor, it is needless to say that a single crystal and a non-single crystal can be used.

As the mask, it is appropriate to use a pattern formed on a quartz plate, using such a high melting point metal as chrome. The quartz plate is necessary for the transmittance of laser beam, and the pattern forming with a high melting point metal is aimed not to melt the pattern. Then, the mask may be formed using aluminum etc. if the energy density of laser beam is low. As the laser beam, XeF excimer laser (wave length, 351 nm), ArF excimer laser (wave length, 193 nm), KrF excimer laser (wave length, 248 nm) and the like can be used. As the kind of laser, it is suitable to use a pulse oscillating type excimer laser, which is of a high peak power and is capable of melting and solidifying the non-irradiated surface within a very short time.

The present invention utilizes a phenomenon that the impurity element contained in an atmosphere will diffuse instantaneously through the molten surface of a semiconductor into the semiconductor, by an irradiation of laser beam. And as the other feature of the present invention, it is indicated that both the doping and the acceleration of impurity can be performed at the same time, and further, a polycrystallization of an amorphous semiconductor can be simultaneously executed, in case the semiconductor is an amorphous one.

The present invention utilizes the above stated phenomenon, conducts selectively the doping of impurity, and further carries out continuously and selectively the doping of different impurity without a progress of photolithography. By using the present invention, it is possible to prepare CMOS type semiconductor device, which is complementarily composed of P-channel type and N-channel type MOS transistor, in a more simple process than the conventional one.

Also, the present invention has been made in the light of solving the above mentioned object, and proposes a method for doping a semiconductor with an impurity which gives one conductivity type, by an irradiation of laser beam (laser light) to the surface of semiconductor, in an atmosphere. of reactive gas containing the one conductivity type impurity. Then, the present invention comprises applying an electromagnetic energy to the atmosphere during the above irradiation of laser, in order to decompose the above reactive gas. Further, it comprises heating a semiconductor which is to be doped, at the crystallization temperature of semiconductor or less, when the laser beam is irradiated.

As the impurity to give one conductivity type, a trivalent impurity, typically B (boron) etc. can be used, if it gives P-type in case of a silicon semiconductor. Conversely, a pentavalent impurity, typically P (phosphorus) or As (arsenic) etc. can be used, if it furnishes N-type. And as the reactive gas containing such an impurity, $AsH_3$, $PH_3$, $BF_3$, $BCl_3$, $B(CH_3)_3$, and the like can be used.

As the semiconductor, in case of the preparation of TFT, an amorphous silicon semiconductor thin film, which is formed by a gas phase growth method or by a sputtering method, is generally used. A polycrystal or a single crystal silicon semiconductor, which is prepared by a liquid phase growth method, can also be used in the present invention. Further, it is needless to say that other semiconductors can be used, not being limited to the silicon semiconductor.

As the laser beam, it is useful to employ a pulse oscillating type excimer laser apparatus, because a heat damage to the substrate is substantially none at all in case of the excimer laser as aforementioned, and there has been an actual result that a polycrystal thin film with a high crystalline property can be obtained, in case an amorphous silicon semiconductor is crystallized by an irradiation of laser.

As an actual kind of laser, it is suitable to use ArF excimer laser (wave length, 193 nm), XeF excimer laser (351 nm), KrF excimer laser (248 nm) and the like.

As the electromagnetic energy which is applied to the decomposition of the reactive gas for a doping (doping gas), 13.56 MHz of high frequency energy is generally used. In case where a laser beam, which can not decompose the doping gas directly, is used, it is possible to efficiently execute a doping, by decomposing the doping gas with this electromagnetic energy. The kind of electromagnetic energy is not limited to the frequency of 13.56 MHz, but a still higher activation rate can be accomplished by using e.g. 2.45 GHz of microwave. Further, it may be possible to use ECR condition which is generated by a mutual action of 2.45 GHz of microwave and 875 gauss of magnetic field. And it is effective to use a light energy which is capable of the direct decomposition of doping gas.

The heating of the semiconductor sample, at a crystallization temperature of semiconductor or less than it, in the laser irradiation is intended to promote the activation of impurity in a semiconductor and the crystallization of a semiconductor, by lengthening the cooling rate of the sample which is momentarily heated by laser beam and by effecting a dehydrogenation of the sample. The crystallization temperature of a semiconductor is the temperature wherein the semiconductor is transformed from an amorphous to a crystal state (in general, microcrystal or polycrystal state), and it is 500 to 550° C. in case of silicon.

This heating at the crystallization temperature or less is resulted from the reason that if a crystalline semiconductor is doped by heating, at a higher temperature than its crystallization temperature, there will occur a controlling trouble of valency electron caused by a generation of levels. Also, in case of TFT using an amorphous silicon (indicated as a-Si:TFT), if it is heated at 350° C. or more according to the present invention, the device will be broken down. Therefore, it is suitable to heat at 350° C. or less in this case.

BRIEF DESCRIPTION OF THE DRAWING

The objects, features, and advantages of the present invention will become more apparent, from the following description of the preferred embodiments taken in conjunction with the accompanying drawings, in which.

DETAILED DESCRIPTION OF THE PREFERRED EMBODIMENT

The present invention will be explained in more detail, by reference to the following Examples in connection with the drawings. The present invention is by no means limited to the Examples, without departing from the spirit and the scope thereof.

EXAMPLE 1

The present Example deals with a selective doping executed in a preparing process for a N-channel type MOSFET of silicon gate, using a mask by a laser beam according to the present invention. In all the Examples described hereinafter, a well known semiconductor device employing a silicon semiconductor was used.

Figure 1:
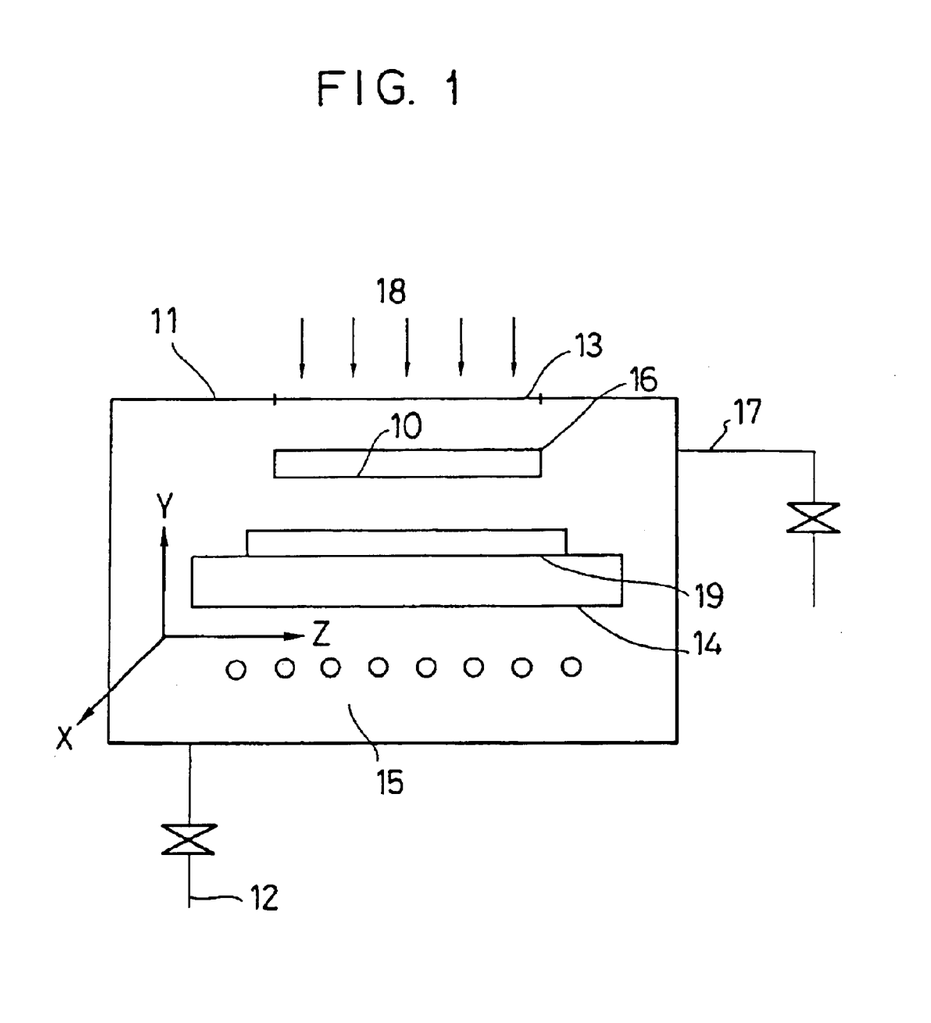
FIG. 1 shows a laser irradiation apparatus used in the present invention.

Firstly, a laser doping system used in the present Example is indicated in FIG. 1, in which the numeral 11 indicates a vacuum chamber equipped with a high vacuum exhausting system 12. The high vacuum exhausting system 12 is connected in series to a rotary pump and a turbo-molecule pump, and operates so as to prevent a disused impurity from being remained in the vacuum chamber 11 to the utmost, by once exhausting air up to a high vacuum state, when an atmosphere in the vacuum chamber 11 is changed over. The numeral 17 indicates an introducing system of a reactive gas and a diluted gas, through which such reactive gas containing one conductivity element as $PH_3$ or $B_2H_6$ is introduced. It is also possible to use hydrogen as a diluted gas. Further, an introducing system of an inert gas such as nitrogen or argon is provided, as occasion demands.

The numeral 13 indicates a quartz window for introducing a laser beam from the outside of the chamber 11. The numeral 14 is XYZ stage, and it can control a position to an accuracy of the order of 1 μm, in the direction to three dimensional XYZ as shown in FIG. 1. Of course, it is useful to raise the accuracy of doping, by employing XYZ stage or X-Y stage having a still higher sensitivity. The numeral 15 is a heater to heat a sample up to a desired temperature. The numeral 16 is a mask having a mask pattern 10 formed on a quartz plate with chrome. The numeral 18 is a laser to be irradiated, and KrF excimer laser (wave length, 248 nm) was used in the present invention. The numeral 19 is a sample, a semiconductor to be doped is placed here.

Figure 2A:
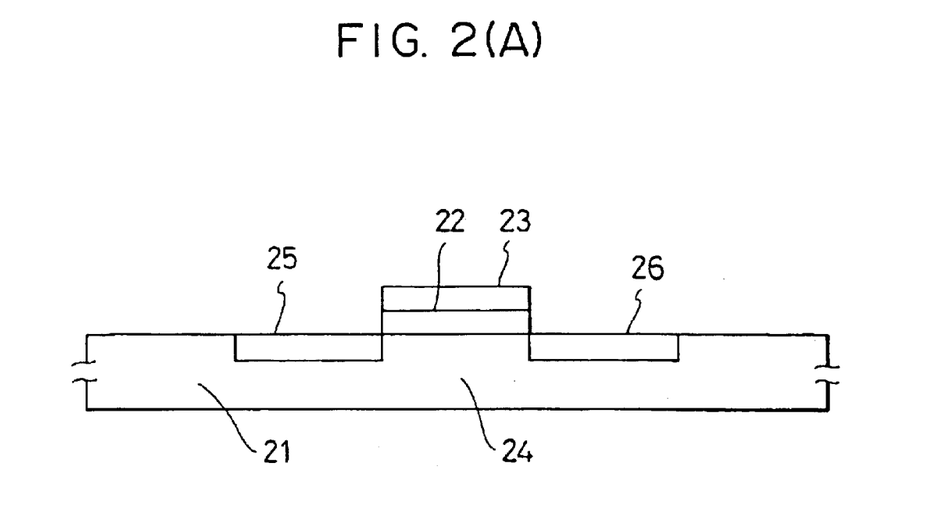
FIG. 2 shows a preparing process of the MOS type transistor in accordance with the Example 1.

A fundamental preparing process of Si gate N-channel type MOS transistor according to the present invention is shown in (A) and (B) of FIG. 2. The gist of the present invention is concerned with a doping of impurity, and it does not restrict the structure and the preparing process in relation to an electrode forming, an insulating film, a circuit and so on, which are not referred to here.

As the Si gate N-channel type MOS transistor, the preparing process of which is shown in FIG. 2, a silicon substrate of P type single crystal indicated as a substrate 21, in which B (boron) was added, was used. This is the same with that used in a conventional Si gate N-channel type MOS transistor. On this substrate 21, a silicon oxide film to be a gate insulating film was formed in 1000 Å thick, by a conventional heat-oxidation method. Still more, B which is a trivalent impurity was ion-implanted in a channel forming region, to control the threshold value voltage. Then, a polycrystal silicon film or an amorphous silicon film, which was to be a gate electrode, was formed in 7000 Å thick by a CVD method or a plasma CVD method. Next, these were patterned to form a gate insulating film 22 and a gate electrode 23 at the same time, by a conventional photolithography process. Up to this point, the usual technology field is stated.

At this condition, the substrate 21 was set up in a vacuum chamber 11 shown in FIG. 1, which was kept in a normal pressure atmosphere of $PH_3$ diluted with hydrogen, in order to diffuse P (phosphorus), which is an impurity containing N-type conductivity, into the prescribed position of the substrate. Then, the positioning to the mask 16 was adjusted using XYZ stage 14 shown in FIG. 1, and along with the doping with P element into a prescribed region which was not masked with a mask, by an irradiation of laser beam, the activation of P and further the polycrystallization of a gate electrode 23, in case the gate electrode was an amorphous silicon, were effected at the same time, thus forming a source region 25, a drain region 26, (of course, these may be reversed each other) and a channel forming region 24.

Here, in order to control a resistance rate, it may be carried out that a diluting ratio of $PH_3$ gas or a pressure of atmosphere will be so modified as to change a doping concentration, or that the number of laser irradiation as well as the power density of laser beam will be changed. Practically, by raising a diluting ratio of doping gas, by lowering an atmospheric pressure, or by lowering a density of laser beam, the doping concentration will be lowered. And it will be raised, if these conditions are contrary to it.

In this process, the channel forming region 24 under the gate, and the source 25 and the drain 26 regions at the both sides thereof will be formed by a self-alignment. So that, the position-adjustment of mask 16 can be admitted of an allowable accuracy of several μm. Namely, it may be well to set up a mask so that a laser beam will be irradiated to a source, drain region and a gate electrode part which are lined up in a straight line. Still, a channel length is 5 μm, but the permissible limit of fine processing applicable to the present invention will be subject to restriction, by the operating accuracy of XYZ stage 14.

Figure 2B:
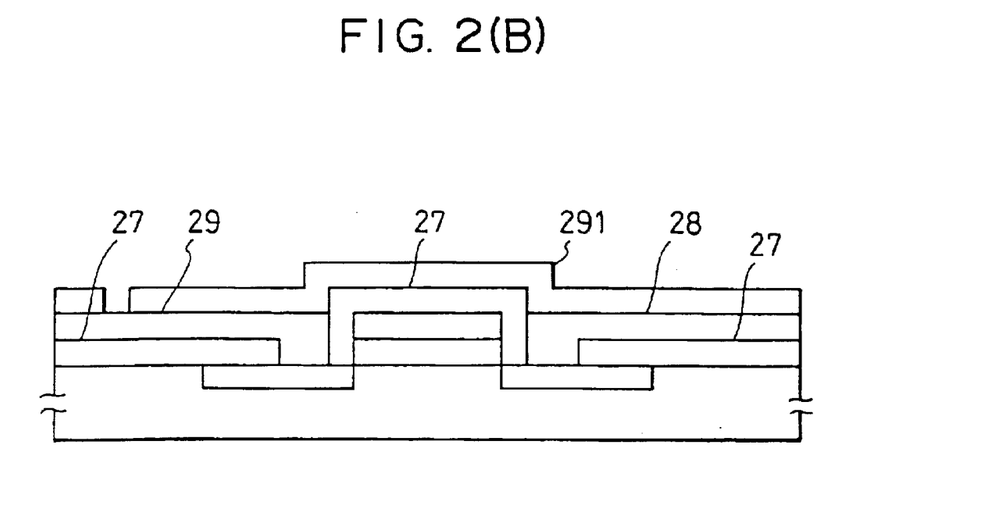

In a subsequent process, an interlayer insulating material, an electrode, and a wiring were prepared to complete a MOS type transistor shown in FIG. 2 (B), by using a conventional technology. In FIG. 2 (B), the numerals 27, 28, and 29 are the interlayer insulating film, the drain electrode, and the source electrode respectively.

In the above process, the mask 16 was kept away from the sample in a distance of 2 mm. This was derived from the reason that a reactive gas containing an impurity element to be doped was made be existed between the mask and the sample surface. In view of a scattering and a diffraction of laser beam, it is preferable that the distance between the mask and the sample is short. But in case there is hardly a gap therebetween, the doping will not be performed efficiently, as the reactive gas can not intrude into it. The distance between the mask and the surface of the sample, therefore, is appropriate to be in a range of 0.1 mm to 5 mm. A laser light may be passed through an enlarged mask pattern and an optical system rather than a mask pattern of full size followed by reducing the laser light to obtain a prescribed pattern for use in doping. The doping may be conducted into the prescribed pattern, forming a pattern in the laser beam, by reducing the laser beam passed through the mask and by using a enlarged mask pattern and a photography system, not using a mask pattern of full size.

It is also possible to accomplish a doping efficiently, by heating a sample at a temperature of around 300 to 500° C., in case of the laser irradiation. Moreover, in the present Example, P (phosphorus) or B (boron), the impurity which gives one conductivity type was used, so as to change a resistance rate of a specified position. But it is possible to diffuse N (nitrogen) into a specified position and to effect a partial insulation thereof, by an irradiation of laser beam in an atmosphere of N, in order to insulate a specified position. Of course, it is also possible to dope oxygen or carbon with a selectively controlled concentration, by using an atmosphere of oxygen gas or carbide gas as other impurity.

According to the present Example, it is possible to efficiently carry out a selective doping, without any mask forming by a photolithography process and also without giving a heat damage in an unnecessary part, thereby obtaining Si gate N-channel type MOS transistor. Still, in the present Example, it is needless to say that the source, drain region of P-channel type MOSFET can be formed, by using an atmosphere of $B_2H_6$ in case of the doping.

The doping technology using a laser beam explained in the present Example can be also applied to the formation of source as well as drain region of an amorphous silicon TFT and a polycrystal silicon TFT provided on a glass substrate. It can also solve a heat damage problem which is brought about, in case of the forming of TFT on a glass substrate, and it can obtain a high performance TFT.

EXAMPLE 2

The present Example deals with the application of the present invention in a preparing process of C/TFT which is formed as a complementary, using N-channel type MOSTFT (hereinafter refer to as NTFT) and P-channel type MOSTFT (hereinafter refer to as PTFT) provided on a glass substrate. In this Example, a silicon semiconductor was also used as a semiconductor. Of course, it is needless to say that the impurity doping technology, which will be explained in this Example, can be applied to the preparation of CMOS integrated circuit on a silicon substrate.

Figure 3A:
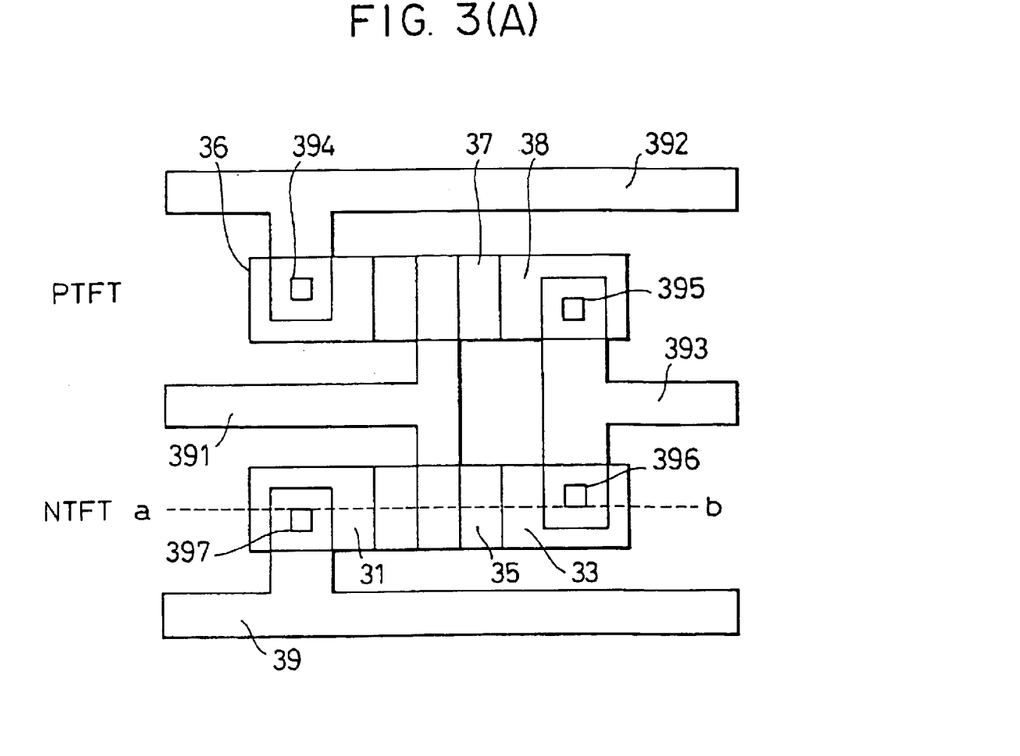
FIG. 3 shows a preparing process and a completed diagram of the C/TFT in accordance with the Example 2.

The preparing process of the present Example is shown in FIG. 3, and the completed upper view of the present Example, which represent CMOS device provided on a glass substrate as a complementary using PTFT and NTFT (hereinafter referred to as C/TFT), is shown in FIG. 3(A). In FIG. 3, the numerals 39 and 392 indicate an input wiring of C/TFT, 393 indicates an output wiring, and 391 indicates a gate electrode wiring. The numerals 394, 395, 396, and 397 are a contact of electrode and wiring, and 31, 35, 33, 36, and 38 indicate a source region of NTFT, a gate electrode, a drain region, a source region of PTFT, and a drain region respectively. The numeral 37 is a gate electrode, under which a channel region of PTFT is formed through a gate insulating film.

Figure 3B:
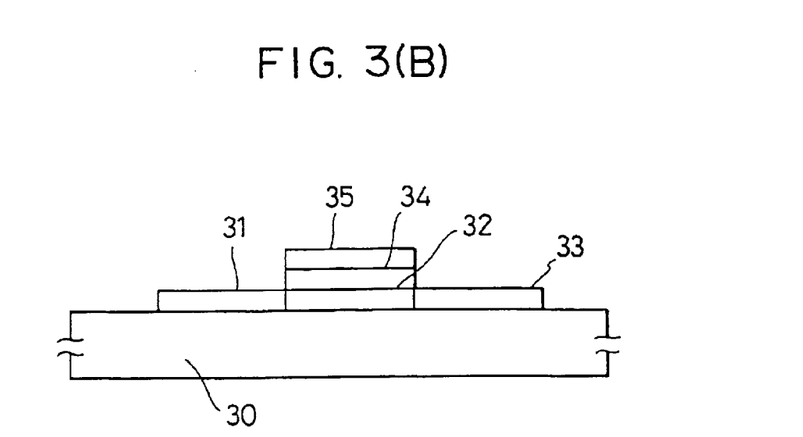

The fragmentary cross sectional view taken in the dotted line a–b of FIG. 3(A) is shown in FIG. 3(B), which is the cross sectional view of NTFT having a fundamental structure wherein none of an electrode, a wiring, and an interlayer insulating film etc. is formed. Therefore, an input wiring 39, 392, an output wiring 393, a gate electrode wiring 391 and a contact 396, 397, which are shown in FIG. 3(A), are not indicated in FIG. 3(B).

The difference between PTFT and NTFT shown in FIG. 3(A) is related to the source, drain region. That is, it is the difference on the point that the conductivity type of source region 31 and drain region 33 of NTFT in FIG. 3 is N-type, on the other hand, the conductivity of source region 36 and drain region 38 of PTFT is P-type.

It is also different from each other in the point that there are cases where the doping with an impurity giving N-type conductivity into PTFT type channel forming region, and with an impurity giving P-type conductivity into NTFT type channel forming region will be executed, in order to control the threshold voltage. Any way, PTFT and NTFT can be prepared differently, by changing a kind of impurity in case of the doping.

Up to the present time, it has been needed to mask the other TFT using a silicon oxide film or a silicon nitride film, while a doping with an impurity has been conducted into one of TFT, in order to form C/TFT circuit. And then, it has been in need of a complicated process to form and remove this mask. The present invention is characterized in that PTFT and NTFT can be prepared selectively, by moving XYZ stage 14 shown in FIG. 1 and by changing the atmosphere in a vacuum chamber 11.

In FIG. 3, the part, which will become NTFT by a preparing process of TFT using a usual silicon semiconductor, is so formed as to be shaped as shown in FIG. 3(B). At this time, it is needless to say that the part to be NTFT is formed neighboring to the part to be PTFT, in the same way as shown in FIG. 3(B). The important point here is that PTFT and NTFT can not be distinguished from each other before the impurity doping. According to the present Example, a doping with an impurity into the channel forming region (shown as 32 in case of NTFT) is not to be executed.

The positioning relationship of a mask, in case where the actual doping with an impurity is conducted into TFT standing in a line according to the present invention, is shown in FIG. 4. Here, the fragmentary cross sectional view taken in the dotted line a–b of FIG. 3 corresponds to FIG. 4(A). FIG. 4(A) is the position where a mask is set up, in case NTFT is formed, and FIG. 4(B) indicates the position where a mask is set up, in case PTFT is formed. Here, the setting up of a mask is actually carried out by that the substrate, which is a sample, moves with XYZ stage, the mask being left fixed.

In FIG. 4, chrome is provided in the part where is indicated by a oblique line, and a laser beam is masked in this part. Also in FIG. 4, the mask is drawn in less size than the actual one, then the positioning relationship between the mask-edge and the TFT is almost equally represented, in both of FIG. 4(A) showing the situation where the sample has not yet been moved toward the mask, and FIG. 4(B) showing the situation where the sample has already been moved toward the mask. Hereinafter the doping process according to the present Example will be explained.

In the first place, the shape indicated in FIG. 3(B) was obtained by being subjected to the known processes. Then, the sample was moved to a vacuum chamber shown in FIG. 1, and the chamber was changed over to an atmosphere comprising an n-type impurity, e.g. $PH_3$ atmosphere kept at a normal pressure, after it was once exhausted of air up to a high vacuum. After that, a mask was set up at a prescribed position so that it was irradiated by a laser beam, as shown in FIG. 4(A). Thereby, P (phosphorus), the impurity giving N-type conductivity was doped and diffused into a first region of a semiconductor (the part to be NTFT) by an irradiation of laser to a surface of the semiconductor, in the same way as the Example 1. As shown in FIG. 4, a mask (oblique line) was not formed in the part to be NTFT (that is, a quartz plate transparent part of a mask was provided on the surface of the semiconductor (the part to be NTFT), and a laser beam (laser light) was irradiated to a sample in this part, through a quartz plate.

Next, the chamber was once exhausted of air until it was in a high vacuum. Then, XYZ stage in FIG. 1 was moved, and as shown in FIG. 4(B), the position of mask, i.e., the part where a pattern for the transmission of laser beam was formed in order to effect the doping, was relatively moved to a second region of the semiconductor (the part to be PTFT of sample) to provide the transparent part on the second region of the semiconductor. Next, PTFT is prepared in the same way as the above preparing case of NTFT, by irradiating a laser beam in an atmosphere comprising a p-type impurity, e.g. $B_2H_6$ atmosphere kept at a normal pressure. Both of PTFT and NTFT are prepared by self-alignment in the same manner as Example 1. It was, therefore, useful to be able to permit an error of mask adjustment to some extent, if the mask was adjusted to the region where TFT was prepared. Also in the present Example, the doping gas was not diluted.

In this way, PTFT and NTFT could be prepared selectively, by only moving the mask relatively to a sample and also by only changing the atmosphere. The doping steps for the PTFT and NTFT may be carried out in the same chamber without exposing the sample to an air. Later on, by a conventional process, one output of PTFT and NTFT, i.e., a drain of them was connected each other to form the output wiring 393 in FIG. 3. Then, the source electrode wiring 39, 392 was formed, and C/TFT was completed by providing the gate electrode wiring 391.

As mentioned above, in the conventional method, a masking process (including a photolithography process) for one side part to become TFT has been needed, to prepare CMOS or C/TFT. However, in accordance with the present invention, it can be accomplished by only a simple process, which makes it possible to eliminate two times photolithography processes, compared with the conventional preparing process, and moreover makes it possible to finish the process corresponding to the above two times processes, i.e., the process to prepare PTFT and NTFT, in the same vacuum chamber. This proves that the very useful performance in a highly fine processing can be attained.

In the present Example, the example of preparation for one C/TFT is described. But if C/TFT is periodically prepared on a substrate, it may be well to use the mask wherein a mask pattern is periodically formed as shown in FIG. 4, and to effect a laser irradiation by shifting it.

In the above Example 2, the n-type impurity was doped into the semiconductor before the p-type impurity was doped thereinto, however, a p-type impurity may be doped into a semiconductor before an n-type impurity is doped thereinto.

EXAMPLE 3

The present Example deals with the case, wherein the doping method according to the present invention is applied to a preparation for N-channel thin film type insulating gate field effect transistor (hereinafter referred to as NTFT) provided on a glass substrate.

In this Example, a glass substrate or a quartz substrate was used as a substrate. This was resulted from the intention that TFT prepared in this Example was used, in an active matrix type liquid display device or a switching element and a driving element of an image sensor. Of course, the present invention can be applied to a doping technology in the formation of P-type semiconductor layer and N-type semiconductor layer in the photo-electric conversion device, and further in the preparation of integrated circuit. Therefore, as a substrate, a silicon or a substrate of single crystal, or polycrystal of other semiconductor, and other insulator can be used.

Figure 5:
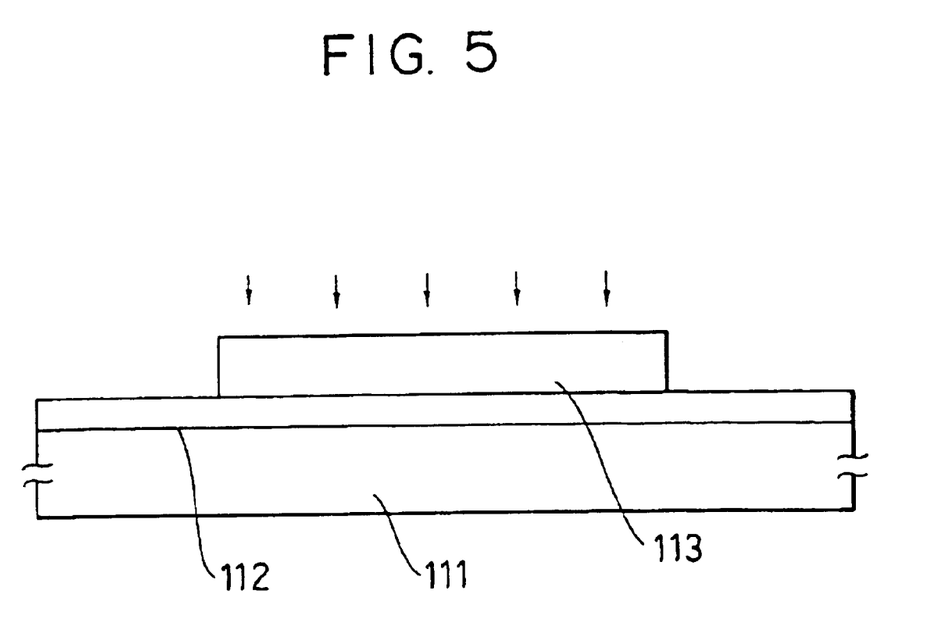
FIG. 5 shows a preparing process in accordance with the Example 3.

Firstly, in FIG. 5, $SiO_2$ film or silicon nitride film was formed on a glass substrate 111, as a base protective film 112. In this Example, $SiO_2$ film 112 was formed in 200 nm thick, by RF sputtering in an atmosphere of 100% oxygen. The film forming conditions were below: $O_2$ flowing amount; 50 sccm, Pressure; 0.5 pa, RF electric power; 500 W, Substrate temperature; 150° C.

Next, an intrinsic or a substantially intrinsic (this is meant by that an impurity is not added artificially) amorphous silicon hydride semiconductor layer 113 was formed, in 100 nm thick by a plasma CVD method. This semiconductor layer 113 became a semiconductor layer which constituted a channel forming region and a source, drain region. The film forming conditions were as follows: Atmosphere; silane ($SiH_4$) 100%, Film forming temperature; 160° C. (substrate temperature), Film forming pressure; 0.05 Torr, Throwing power; 20 W (13.56 MHz). In this Example, silane was used as a film forming raw material. But in case an amorphous silicon is polycrystallized by a heat-crystallization, disilane and especially trisilane may be used, in order to lower a crystallization temperature.

The reason why a film forming is carried out in an atmosphere of 100% silane, is based on the experimental result that the amorphous silicon film formed in this atmosphere is easier to crystallize than that formed in an atmosphere of silane diluted with hydrogen, which is commonly utilized. The low temperature of film forming is due to that hydrogen shall be contained in a film formed amorphous silicon, and that the bonding hand of silicon shall be neutralized with hydrogen as much as possible.

Also, the fact that the throwing power of high frequency wave energy is such low as 20 W is ascribed to prevent a silicon cluster, i.e., a crystalline part to the utmost from being produced in film forming. This is also based on the experimental result that even a little crystal in an amorphous silicon film have a bad effect on the crystallization, in a later irradiation of laser.

Next, a patterning of device separation was conducted to obtain a shape shown in FIG. 5. And a sample was heated at 450° C. for an hour, in a vacuum of $10^{-6}$ Torr or less, to draw out hydrogen thoroughly and to produce a dangling bond in a film high densely. Further, the polycrystallization of sample was effected by an irradiation of excimer laser, in the chamber in which hydrogen was drawn out as above and which was kept in a vacuum condition. This process. was executed using KrF excimer laser (wave length, 248 nm), and followed next. Energy density of laser irradiation; 350 $mJ/cm^2$, Pulse No.; 1 to 10 shot, Substrate temperature; 400° C. After the irradiation of laser, the temperature was lowered to 100° C. in a hydrogen atmosphere (about 1 Torr).

Still, in this Example, the crystallization of an amorphous silicon film by an irradiation of laser was described. But it is needless to say that this may be replaced with a heating process, which is a crystallizing process of an amorphous silicon semiconductor film provided on a glass substrate, by heating at the heat resisting temperature of glass or less thereof, i.e., 450 to 700° C. (in general 600° C.) for 6 to 96 hours.

Figure 9:
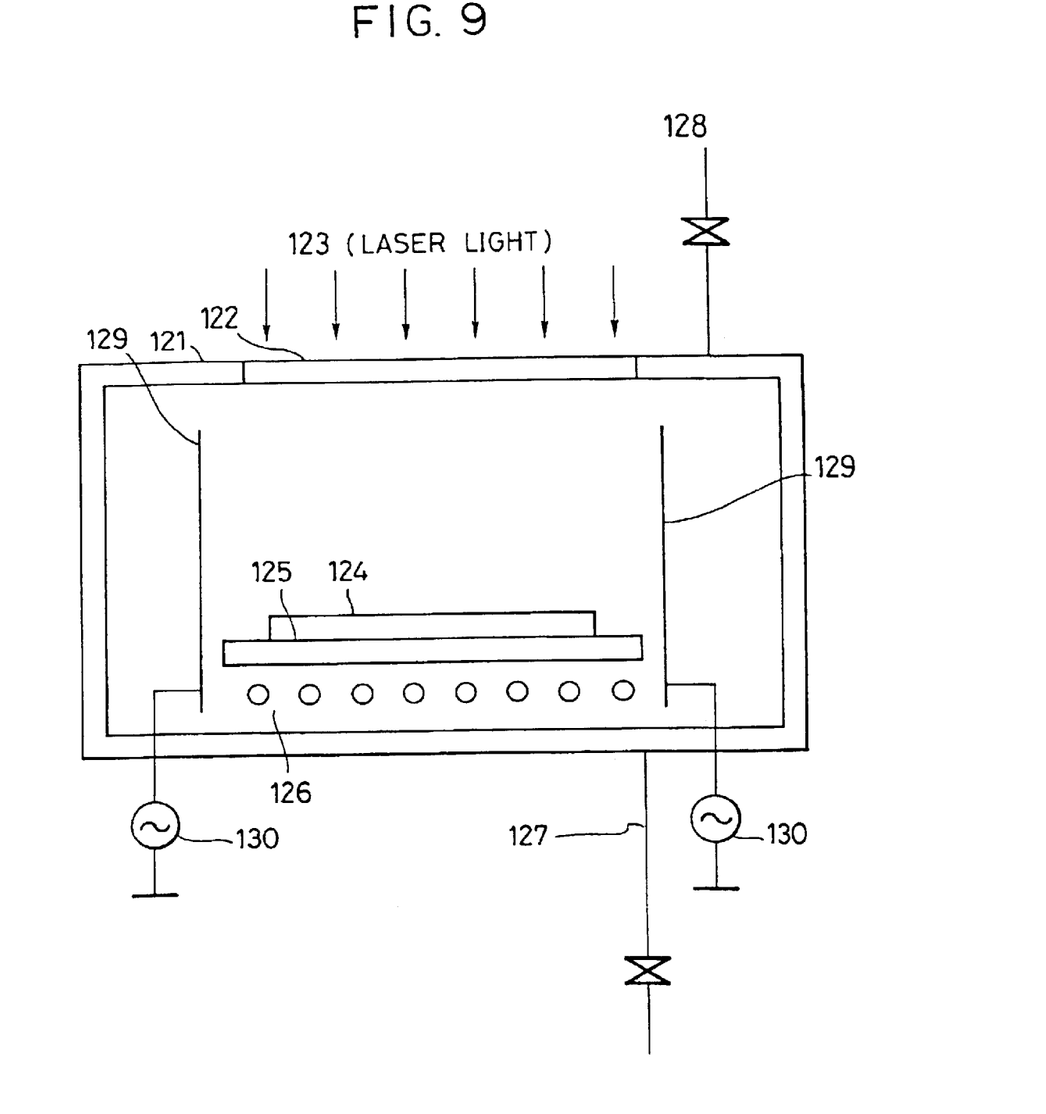
FIG. 9 shows a laser apparatus used in the Example 3.

In this Example, the above stated heating process for the drawing out of hydrogen, crystallizing process by an irradiation of excimer laser beam, and further doping process of impurity were carried out, in the same vacuum chamber using an apparatus shown in FIG. 9. It was easy and simple to maintain a vacuum condition covering the processes from heating to crystallization by a laser irradiation, using such vacuum chamber, thus making it possible to get a film without any mixing of impurity (especially oxygen) therein.

This vacuum chamber is equipped with an electrode to supply the atmosphere with electromagnetic energy, and also can be used as a CVD apparatus. It is, however, possible to carry out process steps continuously in a multi-chamber reaction furnaces by carrying out each of the process steps in corresponding one of the reaction furnaces. The reaction furnace shown in FIG. 9 is a positive column type, but the other type can be acceptable. The adding method for electromagnetic energy is not limited to the specified one. It is also useful to employ a ECR type apparatus, if a specially high activation rate is desired.

In FIG. 9, the numerals indicate as follows: 121; Vacuum Chamber, 122; Quartz Window for an irradiation of laser from the outside of the vacuum chamber 121, 123; Laser Beam (Laser Light) in case of laser irradiation, 124; Sample, 125; Sample Holder, 126; Heater for heating of sample, 127; Exhausting System, 128; Introducing System for raw material gas, inert gas, and carrier gas. In FIG. 9 only one is shown, but a plural of them are actually provided. In the exhausting system., it was tried to decrease a remaining concentration of impurity (especially oxygen) in a chamber to the utmost, using a rotary pump for low vacuum, and a turbo-molecule pump for high vacuum. The numeral 129 is Parallel Plate Electrode, which supplies the chamber with 13.56 MHz of electromagnetic energy provided from High Frequency Wave Generating Apparatus 130.

Figure 6:
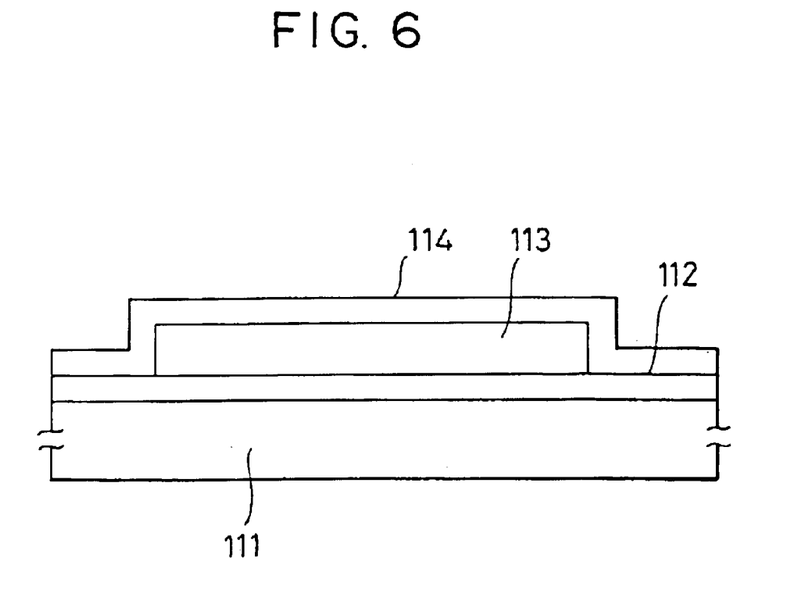
FIG. 6 shows a preparing process in accordance with the Example 3.
Figure 7:
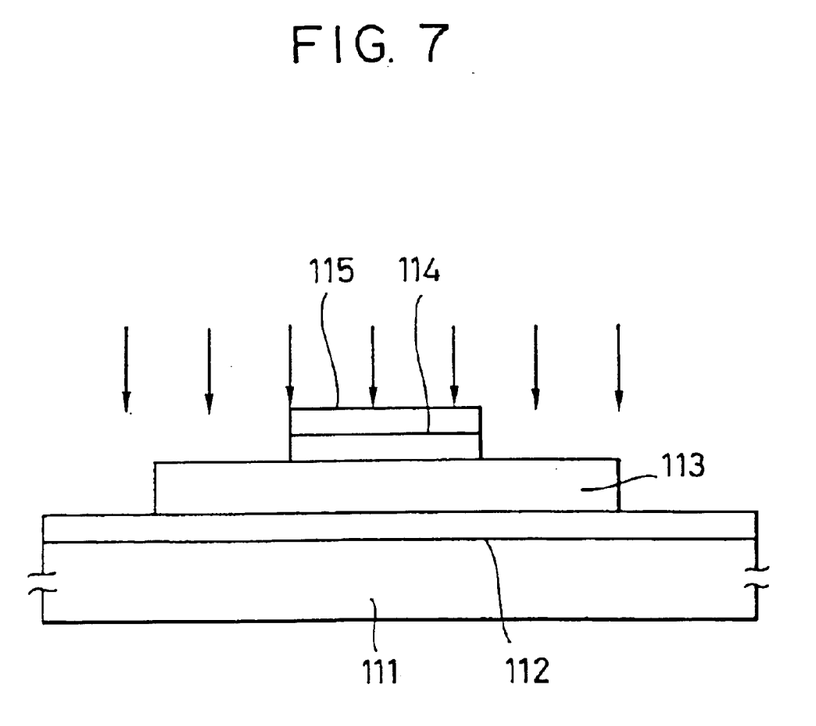
FIG. 7 shows a preparing process in accordance with the Example 3.

After the crystallization by an excimer laser, using a vacuum chamber shown in FIG. 9, $SiO_2$ film 114 to be a gate insulating film was formed in 100 nm thick, using a RF sputtering method, and obtained the shape shown in FIG. 6. Then, an amorphous or a polycrystal silicon semiconductor layer to be a gate electrode 115 (thickness, 150 nm) was provided, by adding P (phosphorus) to prepare N-type conductivity. After that, a gate region was formed by patterning to obtain the shape shown in FIG. 7.

The doping with a laser beam in accordance with the present invention was again effected, using an apparatus shown in FIG. 9, in which a sample (having a shape shown in FIG. 7) was heated and doped with P (phosphorus) by irradiating a laser beam, in an atmosphere of $PH_3$ decomposed by supplying electromagnetic energy. This time, source, drain region (as shown 131, 133 in FIG. 8) was doped with P and became N-type. As compared with this, channel forming region (as shown 132 in FIG. 8) was not irradiated by laser, owing to the masking of a gate insulating film 114 and a gate electrode 115. Then, the temperature of this region was not raised, and the doping thereof was not effected.

The followings were doping conditions: Atmosphere; $SiH_4$ 5% concentration ($H_2$ dilution), Sample Temperature; 350° C., Pressure; 0.02 to 1.00 Torr, Throwing Power; 50 to 200 W, Laser Irradiation Condition; 150 to 350 $mJ/cm^2$ of energy density, using KrF excimer laser (wave length, 248 nm), Pulse No.; 10 to 100 shot.

Figure 8:
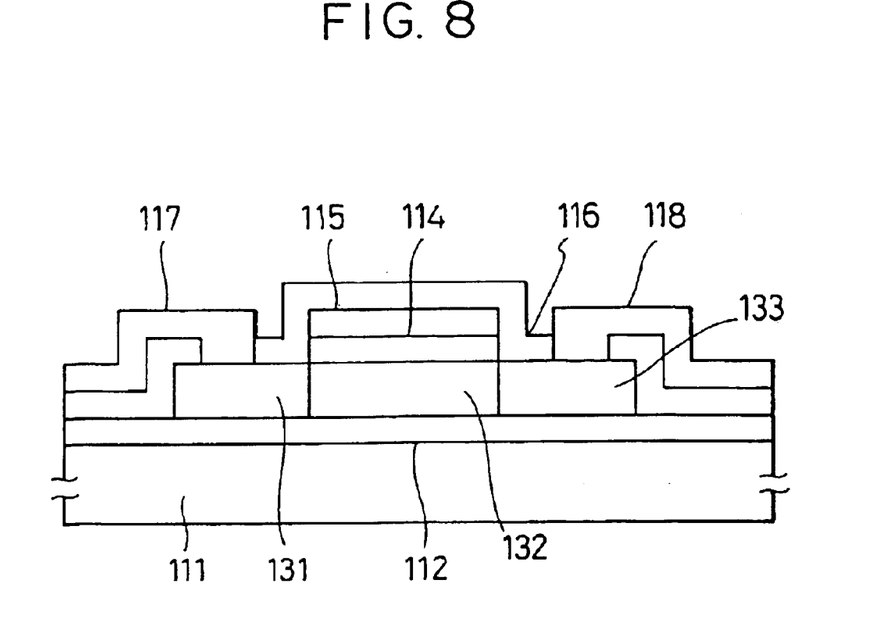
FIG. 8 shows a preparing process in accordance with the Example 3.

After the above mentioned source, drain region was formed, $SiO_2$ film 116 as an insulating film was formed in 100 nm thick, by RF sputtering method as shown in FIG. 8. The film forming condition was the same with that of a gate oxide film. Then, an opening for a contact was formed by patterning, and a source electrode 117 and a drain electrode 118 were formed, by a vapor-deposit method of aluminum to be an electrode. Further, NTFT was completely prepared, by a hydrogen heat-annealing, at a temperature of 350° C. in hydrogen atmosphere.

In this doping process, P-channel type TFT (PTFT) could be prepared, by changing the atmosphere into the one containing $B_2H_6$. Up to this time, a decomposition ratio of doping gas has been different on account of a wave length of laser beam, posing a non-uniformity problem of doping. On the other hand, according to the Example 3 of the present invention, since a doping gas was decomposed not by laser beam but by electromagnetic energy, a doping could be executed in both cases of PTFT and NTFT, without any limitation of laser beam wave length.

As a result stated above, according to the present invention, the doping of a semiconductor with an impurity giving the aforementioned one conductivity type could be efficiently effected, by irradiating a laser beam to an atmosphere containing one conductivity giving impurity which was decomposed by an electromagnetic energy. Especially, the performance that the doping could be carried out, without any heat damage to a glass substrate and also without any influence of a laser beam wave length or any kind of doping gas, was obtained.

Moreover, according to the present invention, the selective doping of the region in compliance with a mask pattern could be performed through a semiconductor surface, by an irradiation of laser beam through the mask, in an atmosphere containing an impurity element giving one conductivity type. Particularly, in case of the forming of C/TFT which was provided as a complementary with CMOS or NTFT and PTFT, it was possible to selectively prepare N-channel type MOS transistor and P-channel type MOS transistor, or PTFT and NTFT, by changing a mask position and an atmosphere. The defect caused by the conventional photolithography process could be diminished.

A modification of the present invention will be described below. The same mask as used in the example of FIG. 4 can be used to form NTFTs having different characteristics on one substrate as follows. The mask is first provided on a sample (semiconductor) so that a transparent part of the mask may be located on one NTFT. Then, an n-type impurity is doped into this NTFT by irradiating the NTFT with a laser light through the transparent part with the gate electrode of the NTFT as a mask to form source and drain regions in the NTFT. This laser doping is carried out under a first condition to obtain a first impurity concentration in the source and drain regions. Next, the mask is relatively moved so that the transparent part may be located on another NTFT. Then, an n-type impurity is doped into this another NTFT by irradiating this another NTFT with a laser light through the transparent part with the gate electrode of this another NTFT as a mask to form source and drain regions in this another NTFT. This laser doping is carried out under a second condition different from the first condition to obtain a second impurity concentration in the source and drain regions of the another NTFT.

By using a p-type impurity instead of the n-type impurity in the above method, PTFTs having different characteristics can be formed on one substrate.

What is claimed is:

1. A method for manufacturing a semiconductor device comprising the steps of:

forming a semiconductor film comprising amorphous silicon and hydrogen over a substrate by using silane which is not diluted with hydrogen;

introducing the substrate to a chamber for introducing an impurity element to the semiconductor film;

preparing an atmosphere comprising a dopant gas diluted with hydrogen;

converting the atmosphere to a plasma by applying an electrical energy thereto; and introducing an impurity element in the dopant gas into the semiconductor film by irradiating a laser light.

2. A method according to claim 1, wherein the silane is selected from the group consisting of monosilane, disilane and trisilane.

3. A method according to claim 1, wherein the dopant gas is selected from the group consisting of $AsH_3$, $PH_3$, $BF_3$, $BCl_3$, $B(CH_3)_3$, and $B_2H_6$.

4. A method according to claim 1, wherein the impurity element is introduced while heating at a temperature from 300 to 500° C.

5. A method for manufacturing a semiconductor device comprising the steps of:

forming a semiconductor film comprising amorphous silicon and hydrogen over a substrate by using silane which is not diluted with hydrogen;

drawing hydrogen out of the semiconductor film;

introducing the substrate to a chamber for introducing an impurity element to the semiconductor film;

preparing an atmosphere comprising a dopant gas diluted with hydrogen;

converting the atmosphere to a plasma by applying an electrical energy thereto; and introducing an impurity element in the dopant gas into the semiconductor film by irradiating a laser light.

6. A method according to claim 5, wherein the silane is selected from the group consisting of monosilane, disilane and trisilane.

7. A method according to claim 5, wherein the dopant gas is selected from the group consisting of $AsH_3$, $PH_3$, $BF_3$, $BCl_3$, $B(CH_3)_3$, and $B_2H_6$.

8. A method according to claim 5, wherein the impurity element is introduced while heating at a temperature from 300 to 500° C.

9. A method for manufacturing a semiconductor device comprising the steps of:

forming a semiconductor film comprising amorphous silicon and hydrogen over a substrate by using silane which is not diluted with hydrogen;

introducing the substrate to a chamber for introducing an impurity element to the semiconductor film;

preparing an atmosphere comprising a dopant gas diluted with hydrogen; and decomposing the dopant gas by applying an electrical energy while irradiating a laser light to the semiconductor film.

10. A method according to claim 9, wherein the silane is selected from the group consisting of monosilane, disilane and trisilane.

11. A method according to claim 9, wherein the dopant gas is selected from the group consisting of $AsH_3$, $PH_3$, $BF_3$, $BCl_3$, $B(CH_3)_3$, and $B_2H_6$.

12. A method for manufacturing a semiconductor device comprising the steps of:
   forming a semiconductor film comprising amorphous silicon and hydrogen over a substrate by using silane which is not diluted with hydrogen;
   drawing hydrogen out of the semiconductor film;
   introducing the substrate to a chamber for introducing an impurity element to the semiconductor islands;
   preparing an atmosphere comprising a dopant gas diluted with hydrogen; and
   decomposing the dopant gas by applying an electrical energy while irradiating a laser light to the semiconductor film.

13. A method according to claim 12, wherein the silane is selected from the group consisting of monosilane, disilane and trisilane.

14. A method according to claim 12, wherein the dopant gas is selected from the group consisting of $AsH_3$, $PH_3$, $BF_3$, $BCl_3$, $B(CH_3)_3$, and $B_2H_6$.

15. A method for manufacturing a semiconductor device having a semiconductor island including at least source and drain regions and a channel region therebetween, and a gate electrode adjacent to the semiconductor island, the comprising the steps of:
   forming a semiconductor film comprising amorphous silicon and hydrogen over a substrate by using silane which is not diluted with hydrogen;
   patterning the semiconductor film to form the semiconductor island;
   introducing the substrate to a chamber for introducing an impurity element to the semiconductor island;
   preparing an atmosphere comprising a dopant gas diluted with hydrogen; and
   decomposing the dopant gas by applying an electrical energy while irradiating a laser light to the semiconductor island to form the source and drain region.

16. A method according to claim 15, wherein the silane is selected from the group consisting of monosilane, disilane and trisilane.

17. A method according to claim 15, wherein the dopant gas is selected from the group consisting of $AsH_3$, $PH_3$, $BF_3$, $BCl_3$, $B(CH_3)_3$, and $B_2H_6$.

18. A method for manufacturing a semiconductor device having a semiconductor island including at least source and drain regions and a channel region therebetween, and a gate electrode adjacent to the semiconductor island, the comprising the steps of:
   forming a semiconductor film comprising amorphous silicon and hydrogen over a substrate by using silane which is not diluted with hydrogen;
   drawing hydrogen out of the semiconductor film;
   patterning the semiconductor film to form semiconductor island;
   introducing the substrate to a chamber for introducing an impurity element to the semiconductor island;
   preparing an atmosphere comprising a dopant gas diluted with hydrogen; and
   decomposing the dopant gas by applying an electrical energy while irradiating a laser light to the semiconductor island to form the source and drain regions.

19. A method according to claim 18, wherein the silane is selected from the group consisting of monosilane, disilane and trisilane.

20. A method according to claim 18, wherein the dopant gas is selected from the group consisting of $AsH_3$, $PH_3$, $BF_3$, $BCl_3$, $B(CH_3)_3$, and $B_2H_6$.

* * * * *